United States Patent
Cooney (10) Patent No.: US 8,593,218 B2
(45) Date of Patent: Nov. 26, 2013

(54) FAST SETTLING LOW POWER LOW NOISE AMPLIFIER

(75) Inventor: Padraig Cooney, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 42 days.

(21) Appl. No.: 13/432,994

(22) Filed: Mar. 28, 2012

(65) Prior Publication Data

US 2013/0113564 A1 May 9, 2013

Related U.S. Application Data

(60) Provisional application No. 61/557,105, filed on Nov. 8, 2011.

(51) Int. Cl.
*H03F 3/45* (2006.01)

(52) U.S. Cl.
USPC .............................. 330/69; 330/259

(58) Field of Classification Search
USPC ................... 330/9, 69, 124 R, 259
See application file for complete search history.

(56) References Cited

U.S. PATENT DOCUMENTS

| | | | | |
|---|---|---|---|---|
| 6,639,464 B2 * | 10/2003 | Hellberg | ................ | 330/124 R |
| 7,352,239 B2 * | 4/2008 | Lee et al. | ................ | 330/124 R |
| 7,443,233 B2 * | 10/2008 | Jang et al. | ................ | 330/9 |

* cited by examiner

*Primary Examiner* — Steven J Mottola
(74) *Attorney, Agent, or Firm* — Kenyon & Kenyon LLP (57) ABSTRACT

Aspects of the present invention provide apparatuses and methods to provide slew rate enhancement during an initial stage of operation of an amplifier and processing of an input signal with low noise introduction during a subsequent amplification stage of operation. During the initial stage, a high bandwidth component of the amplifier can be engaged to provide slew rate enhancement of the overall amplifier. The adaptive slew rate enhancement can be based on a detected imbalance of an output of a low bandwidth component of the amplifier. Once a desired operating state of the amplifier is achieved, the high bandwidth component can be disengaged. The low bandwidth component can then solely operate on a received input signal during the amplification stage. The low bandwidth component can be low power and can introduce low levels of noise, thereby ensuring minimal noise introduction and corruption of the amplified output signal of the amplifier.

26 Claims, 3 Drawing Sheets

FAST SETTLING LOW POWER LOW NOISE AMPLIFIER

CROSS-REFERENCE TO RELATED APPLICATIONS

The present application claims priority to U.S. Provisional Application No. 61/557,105, filed Nov. 8, 2011, the entirety of which is incorporated by reference herein.

BACKGROUND

1. Field of the Invention

The present invention generally relates to amplifiers. More specifically, the present invention provides slew rate enhancement during an initial stage of operation of an amplifier and processing of an input signal with low noise introduction during a subsequent amplification stage of operation.

2. Background Art

Amplifiers often are used with analog-to-digital converters (ADCs) or other signal processing chains. It is generally desired to construct an amplifier to settle quickly and to also introduce low levels of noise. These qualities, however, are usually in tension. That is, conventional amplifiers generally either settle quickly at the cost of introducing high levels of noise or else introduce low levels of noise at the cost of settling slowly.

Accordingly, what is needed is an amplifier that simultaneously achieves both goals of settling quickly and introducing a low level of noise.

BRIEF DESCRIPTION OF THE DRAWINGS

The accompanying drawings illustrate the present invention and, together with the description, further serve to explain the principles of the invention and to enable one skilled in the pertinent art to make and use the invention.

DETAILED DESCRIPTION

Aspects of the present invention provide apparatuses and methods to provide slew rate enhancement during an initial stage of operation of an amplifier and processing of an input signal with low noise introduction during a subsequent amplification stage of operation. During the initial stage of operation, a high bandwidth component of the amplifier can be engaged to provide adaptive slew rate enhancement of the overall amplifier. The adaptive slew rate enhancement can be based on a detected imbalance of an output of a low bandwidth component of the amplifier. Once a desired operating state of the amplifier is achieved, the high bandwidth component can be disengaged. The low bandwidth component can then solely operate on a received input signal during the amplification stage of operation. The low bandwidth component can be designed to be low power and to introduce low levels of noise, thereby ensuring minimal noise introduction and corruption of the amplified output signal of the amplifier.

Figure 1:
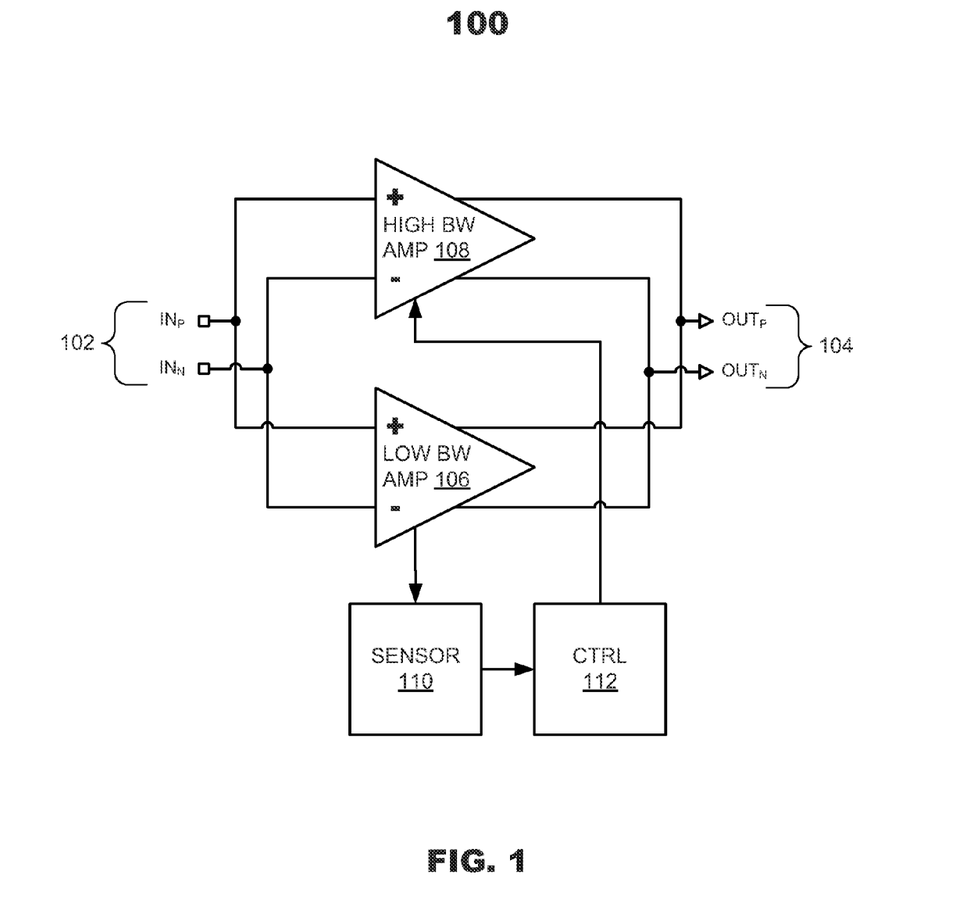
FIG. 1 illustrates an amplifier in accordance with an aspect of the present invention.

FIG. 1 illustrates an amplifier 100 in accordance with an aspect of the present invention. As shown in FIG. 1, the amplifier 100 can include an input terminal 102, an output terminal 104, a low bandwidth amplifier component 106, a high bandwidth amplifier component 108, a sensor 110, and a controller 112.

The input terminal 102 can be a differential input terminal. Specifically, the input terminal 102 can include a first component of a differential input terminal (labeled as "$IN_P$" in FIG. 1) and a second component of a differential input terminal (labeled as "$IN_N$" in FIG. 1). The amplifier 100 can receive an input signal at the differential input terminal 102. The input signal can be a differential signal (e.g., a differential input voltage).

The output terminal 104 can be a differential output terminal. Specifically, the output terminal 104 can include a first component of a differential output terminal (labeled as "$OUT_P$" in FIG. 1) and a second component of a differential output terminal (labeled as "$OUT_N$" in FIG. 1). The amplifier 100 can provide an output signal at the differential output terminal 104. The output signal can be an amplified version of the input signal received at the differential input terminal 102. The output signal can be a differential signal (e.g., a differential output current). The output signal can be provided to a subsequent amplifier stage (e.g., the output signal can be provided to a second stage amplifier within a larger signal processing chain).

The low bandwidth amplifier component 106 and the high bandwidth amplifier component 108 can be coupled to the input terminal 102 and the output terminal 104. The low bandwidth amplifier component 106 can have a relatively lower slew rate and can operate with lower relative noise. The high bandwidth amplifier component 108 can have a relatively higher slew rate and can operate with higher relative noise. The high bandwidth amplifier component 108 can be used initially to quickly place the amplifier 100 into a desired operating state.

During an initial stage of operation, both the high bandwidth amplifier component 108 and the low bandwidth amplifier component 106 can operate on a received input signal. The high bandwidth amplifier component 108 can largely drive an output of the amplifier 100 until the low bandwidth amplifier component 106 can catch up. Once a desired operating state of the amplifier 100 is achieved, the high bandwidth amplifier component 108 can be disengaged and the low bandwidth amplifier component 106 can subsequently be used to solely operate on the input signal. This configuration enables the amplifier 100 to benefit from the desirable qualities of a high bandwidth amplifier (e.g., by way of the high bandwidth amplifier component 108) and the desirable qualities of a low bandwidth amplifier (e.g., by way of the low bandwidth amplifier component 106). Specifically, the configuration of the amplifier 100 enables it to provide a quick response to place the amplifier 100 into a desired operating state as well as low noise introduction when operating on the input signal once the desired operating state is achieved.

The relative high slew rate of the high bandwidth amplifier component 108 can ensure the amplifier 100 has a relatively short settling time. For example, the high bandwidth amplifier component 108 can be engaged to reduce or minimize the amount of time required for an input signal that is being amplified to reach and stay within a desired accuracy. Once the desired accuracy or desired operating state is achieved, the high bandwidth amplifier component 108 can be disengaged so that its noise contribution to an amplified output signal can be removed.

The high bandwidth amplifier component 108 can be disengaged prior to a final desired accuracy or operating state is achieved. That is, the high bandwidth amplifier component 108 can be disengaged after an initial (e.g., non-final) desired operating state of the overall amplifier 100 (e.g., the low bandwidth amplifier component 106) is achieved. The low bandwidth amplifier component 106 can then solely ensure the amplifier 100 settles to the final desired accuracy or operating state. Once settled, the amplifier 100 can more accurately operate on a given input signal. Further, with only the low bandwidth amplifier component 106 engaged, a next stage amplifier, for example, can receive an amplified signal that has low RMS noise. The properties of the low bandwidth amplifier 106 (e.g., $g_m$ and/or gain) can be selected to ensure low noise introduction for a desired bandwidth (and achieved more easily since the same component is not also the primary component for ensuring a fast settling time of the amplifier 100).

As further shown in FIG. 1, the sensor 110 can be coupled to the low bandwidth amplifier component 106. The controller 112 can be coupled to an output of the sensor 110 and can be coupled to the high bandwidth amplifier component 108. The sensor 110 can detect the operating state of the amplifier 100. For example, the sensor 110 can detect an imbalance between differential input signals provided to the amplifier 100 during an initial or warm-up stage of operation (and therefore an imbalance between differential output signals provided by the amplifier 100). The imbalance can be indicative of the amplifier 100 not being in a desired operating state. The imbalance can be detected by the sensor 110 by monitoring, for example, the output of the low bandwidth amplifier component 106.

Based on the imbalance detected by the sensor 110, the controller 112 can engage or disengage the high bandwidth amplifier component 108 as appropriate. When engaged or coupled to the amplifier 100, the high bandwidth amplifier component 108 can be used to adjust the operating state of the amplifier 100. Specifically, the high bandwidth amplifier component 108 can reduce the imbalance of the differential output signals of the amplifier 100. The high bandwidth amplifier component 108 can be used to boost the slew currents of the amplifier 100 and can be considered as providing slew rate enhancement. Once a desired operating state is achieved (e.g., once the imbalance is reduced to an acceptable amount or below a predetermined threshold), the controller 112 can disengage the high bandwidth amplifier component 108. Further, once the high bandwidth amplifier component 108 is disengaged, the low bandwidth amplifier component 106 can only operate on the input signal. This allows the input signal to be processed by the amplifier 100 with minimal noise introduction at the appropriate time.

How substantially or quickly the high bandwidth amplifier component 108 operates to adjust the imbalance can be a function of the amount of the imbalance detected by the sensor 110. For example, a higher imbalance can cause the high bandwidth amplifier component 108 to adjust operation of the amplifier 100 more substantially to place the amplifier 100 into a desired operating state or condition. Further, a lower imbalance can cause the high bandwidth amplifier component 108 to adjust operation of the amplifier 100 less substantially (e.g., as convergence to a desired operating point is approached). Slew rate enhancement can be provided by the controller 112 amplifying, for example, the differential output current(s) of the low bandwidth amplifier component 106 and coupling this amplified current to the high bandwidth amplifier component 108. The level of amplification can be based on the degree of imbalance detected by the sensor 110. The amount of amplification can be constant or time-varying as well. The amplified current can be provided as a tail biasing current to the high bandwidth amplifier component 108 to boost slew currents and the overall slew rate of the amplifier 100.

The amount of time the high bandwidth amplifier component 108 operates to adjust the operating state of the 100 can also be a function of the amount of imbalance. For example, once the imbalance is reduced to a predetermined amount (e.g., below or equal to or less than a predetermined threshold), the controller 206-2 can disengage the high bandwidth amplifier component 108 to allow the low bandwidth amplifier component 106 to subsequently only operate on the input signal.

Alternatively, the controller 112 can simply engage the high bandwidth amplifier component 108 for a predetermined amount of time. During the predetermined amount of time (e.g., a predetermined maximum amount of time), the high bandwidth amplifier component 108 can operate to adjust the operating state of the amplifier 100 (e.g., based on the amount of imbalance as discussed above). After the predetermined amount of time lapses, the high bandwidth amplifier component 108 can be disengaged to allow the low bandwidth amplifier component 106 to subsequently only operate on the input signal.

Further, the amplifier 100 can be configured to engage the high bandwidth amplifier component 108 for a predetermined amount of time in combination with a comparison to a predetermined threshold. For example, the high bandwidth amplifier component 108 can be configured and controlled to be engaged for no longer than a specified amount of time and during this maximum window of operation the detected imbalance can be also compared to a predetermined threshold. If the detected imbalance is reduced to be approximately less than (or less than or equal to) the predetermined threshold during the window of operation, then the controller 112 can disengage the high bandwidth amplifier component 108 prior to the end of the time period during which the high bandwidth amplifier component 108 is allowed to operate.

Figure 2:
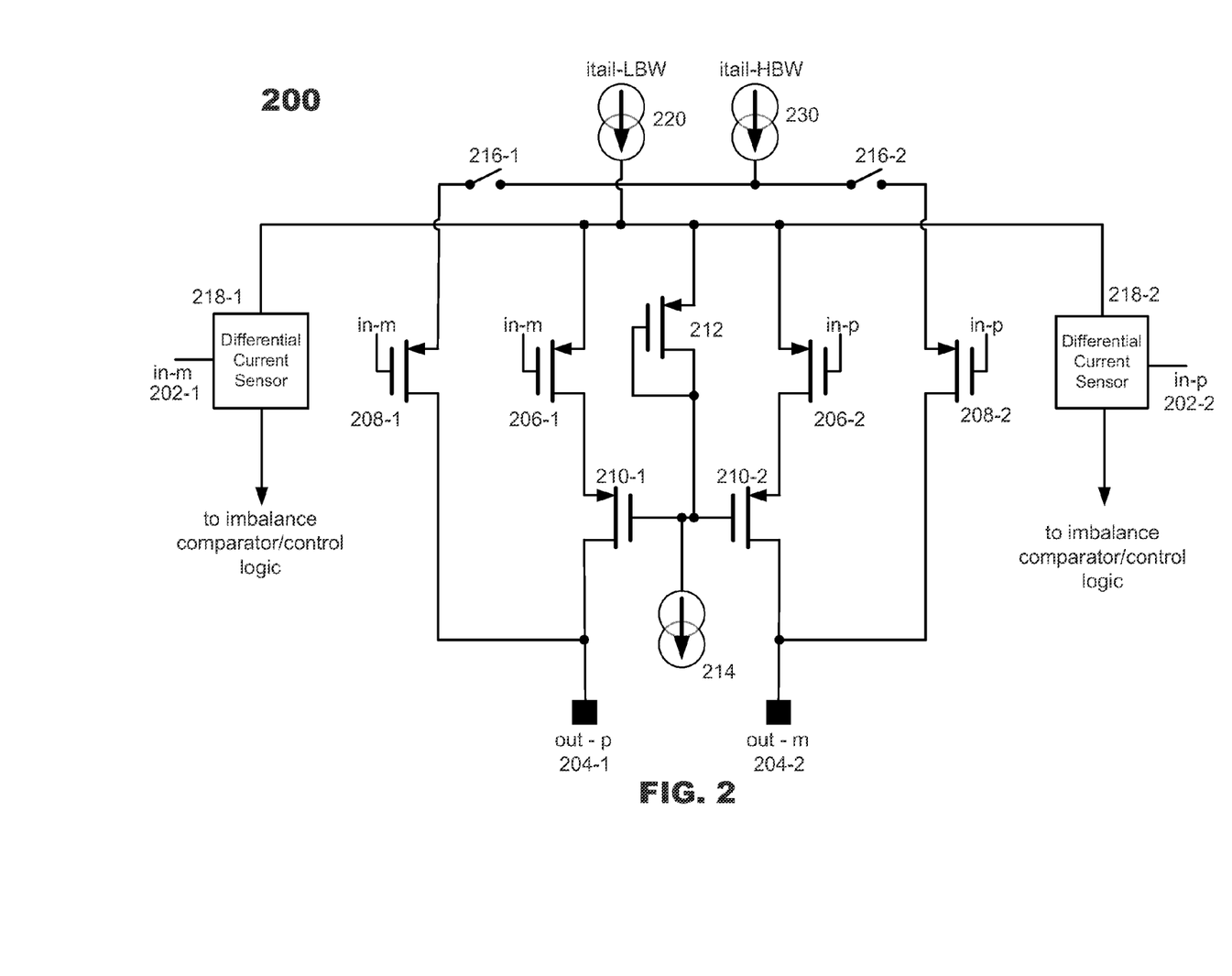
FIG. 2 illustrates an exemplary implementation of the amplifier illustrated in FIG. 1 in accordance with an aspect of the present invention.

FIG. 2 illustrates an amplifier 200 as an exemplary implementation of the amplifier 100 illustrated in FIG. 1 in accordance with an aspect of the present invention. The amplifier 200 can receive a differential input signal and can include a first component of a differential input terminal 202-1 and a second component of a differential input terminal 202-2 (labeled as "in-m" and "in-p" in FIG. 2, respectively). The first component of the differential input terminal 202-1 can receive a first component of a differential input signal (e.g., a first component of a differential input voltage). The second component of the differential input terminal 202-2 can receive a second component of the differential input signal (e.g., a second component of the differential input voltage).

The amplifier 200 can provide a differential output signal and can include a first component of a differential output terminal 204-1 and a second component of a differential output terminal 204-2 (labeled as "out-p" and "out-m" in FIG. 2, respectively). The first component of the differential output terminal 204-1 can provide a first component of a differential output signal (e.g., a first component of a differential output current). The second component of the differential output terminal 204-2 can provide a second component of the differential output signal (e.g., a second component of the differential output current).

As further shown in FIG. 2, the amplifier 200 can further include a first differential transistor pair 206-1 and 206-2, a second differential transistor pair 208-1 and 208-2, a cascode differential transistor pair 210-1 and 210-2, a transistor 212, a current source 214, a pair of switches 216-1 and 216-2, and differential current sensors 218-1 and 218-2.

The first component of the differential input terminal 202-1 can be coupled to the differential current sensor 218-1, the transistor 206-1, and the transistor 208-1. Specifically, gates of the transistors 206-1 and 208-1 can be coupled to the first component of the differential input terminal 202-1. The second component of the differential input terminal 202-2 can be coupled to the differential current sensor 218-2, the transistor 206-2, and the transistor 208-2. Specifically, gates of the transistors 206-2 and 208-2 can be coupled to the second component of the differential output terminal 202-2.

The second differential transistor pair 208-1 and 208-2 can be coupled to the differential output terminals 204-1 and 204-2 of the amplifier 200. Specifically, the transistor 208-1 can be coupled to the first component of the differential output terminal 204-1 and the transistor 208-2 can be coupled to the second component of the differential output terminal 204-2. The first differential transistor pair 206-1 and 206-2 can be coupled to the cascode differential transistor pair 210-1 and 210-2. Specifically, the transistor 206-1 can be coupled to the cascode transistor 210-1 and the transistor 206-2 can be coupled to the cascode transistor 210-2. The cascode differential transistor pair 210-1 and 210-2 can be coupled to the differential output terminals 204-1 and 204-2 of the amplifier 200. Specifically, the cascode transistor 210-1 can be coupled to the first component of the differential output terminal 204-1 and the cascode transistor 210-2 can be coupled to the second component of the differential output terminal 204-2. The transistor 212 and the current source 214 can facilitate the biasing and common mode operation of the amplifier 200.

The first differential transistor pair 206-1 and 206-2 can be the low bandwidth transistors of the amplifier 200 (e.g., forming a portion of the low bandwidth amplifier component of the amplifier 200). That is, the first differential transistor pair 206-1 and 206-2 can be low noise transistors and can be configured to always be biased to be operational. Based on a received differential input signal to the amplifier 200, the low bandwidth transistors 206-1 and 206-2 can generate output currents that can be respectively coupled to the cascode differential pair 210-1 and 210-2 and subsequently correspondingly coupled to the differential output terminals 204-1 and 204-2. The low bandwidth transistors 206-1 and 206-2 can be coupled to a first biasing current 220 (labeled as "itail-LBW" in FIG. 2). The differential current sensors 218-1 and 218-2 can also be coupled to the biasing current 220.

The second differential transistor pair 208-1 and 208-2 can be the high bandwidth transistors of the amplifier 200 (e.g., forming a portion of the high bandwidth amplifier component of the amplifier 200). That is, the second differential transistor pair 208-1 and 208-2 can be selected to provide a relatively high slew rate at the expense of introducing relatively higher levels of unwanted noise.

The high bandwidth transistors 208-1 and 208-2 can be coupled to a second biasing current 230 (labeled as "itail-HBW" in FIG. 2) through switches 216-1 and 216-2, respectively. When the switches 216-1 and 216-2 are turned on, the biasing current 230 can be coupled to the high bandwidth transistors 208-1 and 208-2, thereby activating the high bandwidth transistors 208-1 and 208-2 and coupling them to the amplifier 200. When the switches 216-1 and 216-2 are turned off, the biasing current 230 can be de-coupled from the high bandwidth transistors 208-1 and 208-2, thereby de-activating the high bandwidth transistors 208-1 and 208-2 and de-coupling them from the amplifier 200. In this way, the high bandwidth transistors 208-1 and 208-2 can be selectively engaged and disengaged during operation of the amplifier 200.

During an initial or transient state of operation of the amplifier 200, the components of the differential input signal received at input terminals 202-1 and 202-2 can be substantially different. When the components of the received differential input signal are not the same, the low bandwidth differential pair 206-1 and 206-2 can be imbalanced such that their respective output currents are also imbalanced.

The differential current sensors 218-1 and 218-2 can sense the imbalance of the output currents provided by the low bandwidth differential pair 206-1 and 206-2. Alternatively, or in addition thereto, the differential current sensors 218-1 and 218-2 can sense the imbalance of the output currents provided by the cascode differential transistor pair 210-1 and 210-2. As an example, the differential current sensors 218-1 and 218-2 can be current mirrors or replicators. The differential current sensor 218-1 can produce a current that mirrors or replicates the current output by the transistor 206-1 and/or the current output by the transistor 210-1. Similarly, the differential current sensor 218-2 can produce a current that mirrors or replicates the current output by the transistor 206-2 and/or the current output by the transistor 210-2. The outputs of the differential current sensors 218-1 and 218-2 can be provided to an imbalance comparator/controller (not shown for simplicity). The imbalance comparator/controller can be, for example, the controller 112 illustrated in FIG. 1. The imbalance comparator/controller can include logic and control features to detect and determine an amount or size (e.g., magnitude) of the imbalance between the currents generated by the differential current sensors 218-1 and 218-2 (and therefore a measure of an amount or size of the imbalance between the currents generated by the transistors 206-1 and 206-2 and/or the transistors 210-1 and 210-2).

The imbalance comparator/controller can also generate the biasing tail current 230. The imbalance comparator/controller can generate the biasing tail current 230 based on the determined imbalance between the currents generated by the differential current sensors 218-1 and 218-2 (e.g., by amplifying the determined imbalance or detected difference). Furthermore, the imbalance/controller can provide the biasing tail current 230 to the amplifier 200 (e.g., by providing the biasing tail current 230 to the high bandwidth transistors 208-1 and 208-2 by activating and de-activating the switches 216-1 and 216-2). The switches 216-1 and 216-2 can be transistor switches or can be configured to be transmission gates.

When the switches 216-1 and 216-2 are closed, for example, the high bandwidth differential pair 208-1 and 208-2 can contribute to the differential output currents provided to the differential output terminals 204-1 and 204-2 and can increase the overall slew rate or response time of the amplifier 200. The amount of this contribution can be based on the size or magnitude of the biasing tail current 230 which, in turn, can be based on the size of the imbalance of the output currents provided by the low bandwidth differential pair 206-1 and 206-2 that can be sensed by differential current sources 218-1 and 218-2. Accordingly, a higher imbalance can result in a higher contribution by the high bandwidth differential pair 208-1 and 208-2 while a lower imbalance can result in a lower contribution by the high bandwidth differential pair 208-1 and 208-2. Over time, the contribution of the high bandwidth differential pair 208-1 and 208-2 can help reduce an imbalance of output currents provided by the low bandwidth differential pair 206-1 and 206-2.

During initial operation of the two stage amplifier, the differential input signal received by the input terminals 202-1 and 202-2 can be very different causing a relatively large imbalance in the output currents generated by the low bandwidth differential pair 206-1 and 206-2. In response to this relatively large imbalance, as sensed by the differential current sensors 218-1 and 218-2, the imbalance comparator/controller can generate a relatively high biasing tail current 230 to reduce the imbalance. Over time—when the amplifier 200 is still in a transient state of operation—the imbalance the output of the amplifier 200 can be reduced. As such, the magnitude of the biasing tail current 230 can be reduced at this later stage of transient operation. Once the imbalance is reduced to an acceptable predetermined level or is below a predetermined threshold, for example, the high bandwidth differential pair 208-1 and 208-2 can be disengaged from the amplifier 200 (e.g., by opening the switches 216-1 and 216-2) when a desired operating state is achieved. At this point, the low bandwidth differential pair 206-1 and 206-2 can operate on the differential input signal solely while minimizing the amount of introduced noise.

As described above, the high bandwidth differential pair 208-1 and 208-2 can be used to alter the operating point of the amplifier 200 for a predetermined amount of time. Under this scenario, the high bandwidth differential pair 208-1 and 208-2 operates in conjunction with the low bandwidth amplifier components of the amplifier 200 until the predetermined amount of time lapses after which the high bandwidth differential pair 208-1 and 208-2 is disengaged. Accordingly, the comparator/controller can include logic to monitor the amount of time during which the high bandwidth differential pair 208-1 and 208-2 are engaged and can disengage the high bandwidth differential pair 208-1 and 208-2 once an allowable window of operation has passed. The allowable window of operation can be the end of the initial stage of operation of the amplifier 200 and can be set by determining a maximum period or amount of time of operation.

As also described above, the high bandwidth differential pair 208-1 and 208-2 can be engaged during a period of time during which the imbalance as detected by the comparator/controller exceeds a predetermined acceptable imbalance (e.g., by comparison to a predetermined threshold). Accordingly, the comparator/controller can include a comparator to compare the detected imbalance to a predetermined threshold. The predetermined can be time-varying. The comparator/controller can then use an output of the comparator to determine if the high bandwidth differential pair 208-1 and 208-2 should be engaged or disengaged from the amplifier 200. The predetermined threshold can be a non-zero value. A non-zero value can be used, for example, to compensate for a delay in an operation of the amplifier 200 (e.g., the comparator/controller). Further, the predetermined threshold can be set such that a desired operating state is not fully reached when the high bandwidth amplifier component is disengaged such that the low bandwidth amplifier component can solely settle the amplifier 200 to a desired state.

The amplifier 200 can include additional biasing elements not shown to ensure proper operation of the transistors 206-1, 206-2, 208-1, 208-2, 210-1, and 210-2 and which are not shown in FIG. 2 for simplicity. The differential amplifier 200 is also not limited to implementation using PMOS transistors but can be implemented using NMOS technology as well as other transistor technologies including BJTs. Further, the amplifier 200 can be implemented as a single-ended amplifier.

The differential current sources 218-1 and 218-2 can generate one or more replicated output currents of the transistors 206-1 and 206-2 and/or can generate one or more replicated output currents of the transistors 210-1 and 210-2. The comparator/controller can subsequently use the replicated output currents to generate a difference signal, for example, between the replicated output currents. The comparator/controller can include logic to account for either replicated output current being positive or negative such that a magnitude of the difference between the replicated output currents can be determined.

An aspect of the present invention enables the high bandwidth amplifier component of the amplifier 200 to remain coupled to the amplifier 200 rather than being decoupled from the amplifier 200 at the end of the initial stage of operation. For example, the transistors 208-1 and 208-2 can remain coupled to the amplifier 200 and can be biased by a nominal biasing current. This nominal biasing can limit the noise contribution of the transistors 208-1 and 208-2 after the initial stage of operation. Under this scenario, when the biasing current 230 is de-coupled from the transistors 208-1 and 208-2, the contribution of the transistors 208-1 and 208-2 in reducing the detected imbalance can be substantially removed. This biasing can also be used in conjunction with the operation of the high bandwidth amplifier component as described above during the initial stage of operation of the amplifier 200 such that some minimal biasing is provided in addition to providing the biasing current 230.

As described above, the amplifier 200 can provide an adaptive slew rate or adaptive slew rate enhancement by selectively engaging and disengaging the transistors 208-1 and 208-2 to help reduce an imbalance of the outputs of the transistors 206-1 and 206-2 and/or the transistors 210-1 and 210-2. Further, the adaptation or enhancement of the slew rate of the amplifier can be based on the detected imbalance. Once the imbalance has been reduced to a desired level—as determined by comparison to a predetermined threshold and/or as determined by enabling slew rate enhancement to occur up to a predetermined amount of time—an input signal can be amplified by a portion of the amplifier 200 that can be designed to be low bandwidth, low noise and low power, thereby ensuring the amplified output signal is provided to a next stage device with minimal noise and corruption.

Figure 3:
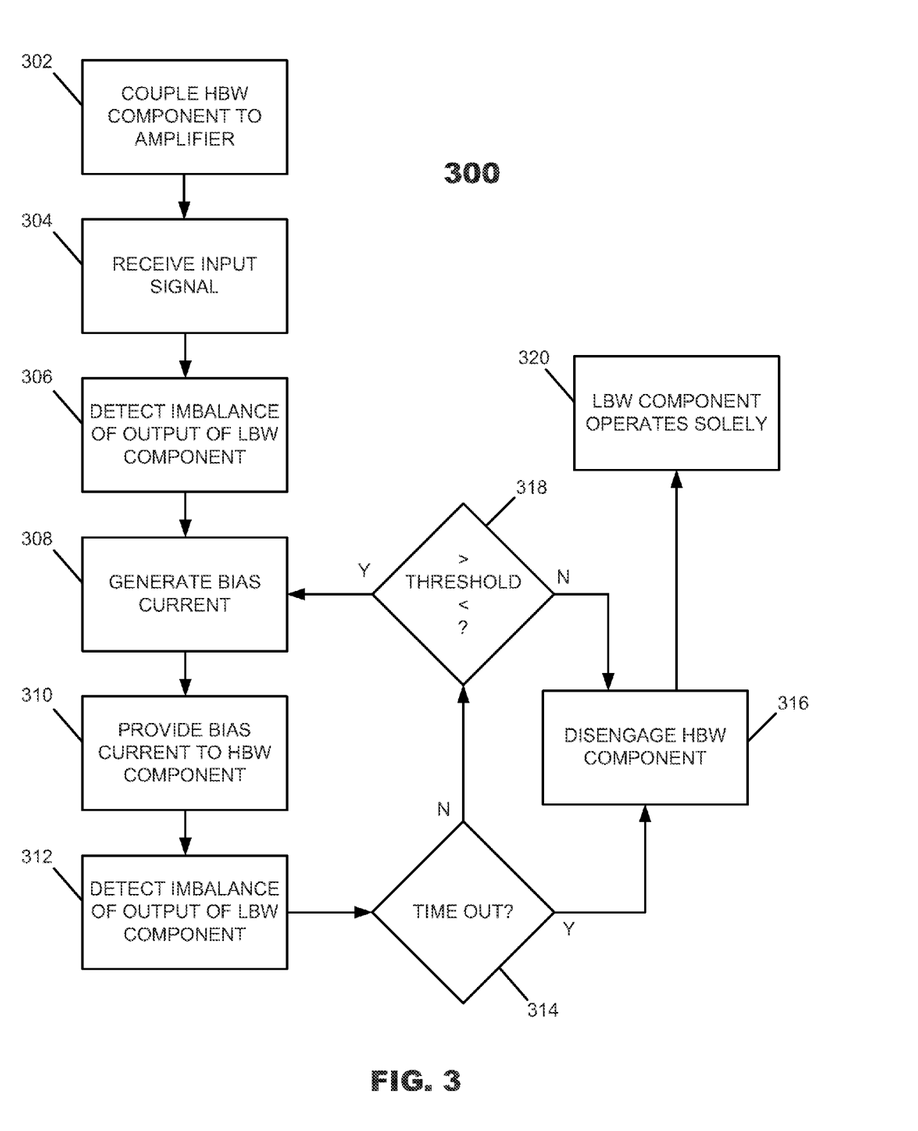
FIG. 3 provides an exemplary flowchart illustrating a method for providing fast settling low noise amplification of a signal in accordance with an aspect of the present invention.

FIG. 3 provides an exemplary flowchart illustrating a method 300 for providing fast settling low noise amplification of a signal in accordance with an aspect of the present invention. The method 300 can enable an amplifier configured and operating according to an aspect of the present invention to quickly settle to a desired operating state or accuracy during an initial stage of operation and then operate on a received signal with low noise introduction (e.g., amplify), thereby maintaining signal integrity and fidelity. The method 300 can be implemented by the amplifier 100 and the amplifier 200 described above in relation to FIGS. 1 and 2, respectively. The method 300 is exemplary and an aspect of the present invention provides for the steps of the method 300 to be performed in different sequences or with multiple steps being performed at substantially the same time.

At step 302, a high bandwidth amplifier component of an amplifier can be engaged. Specifically, the high bandwidth amplifier component can be coupled to an amplifier. The high bandwidth amplifier component can include one or more high bandwidth transistors capable of providing slew rate enhancement relative to the other components of the amplifier. The high bandwidth amplifier component can be coupled to the amplifier by activating one or more switches (e.g., transistor switches or transmission gates). The high bandwidth amplifier component can be coupled to an input (e.g., a differential input) and an output (e.g., a differential output) of the amplifier.

At step 304, an input signal can be received. The input signal can be a differential signal received at a differential input of the amplifier. During this step, the high bandwidth amplifier component and the other components of the amplifier (e.g., a low bandwidth amplifier component of the amplifier) can receive and operate on the received input signal to generate an output signal of the amplifier. The output signal can be a differential output signal.

At step 306, an imbalance of an output signal of the low bandwidth amplifier component can be detected, and/or an output of the amplifier. For example, the low bandwidth amplifier component can generate a differential output signal comprising a first component and a second component. An imbalance between the first and second components of the differential output signal can be measured (e.g., a difference in magnitude of the first and second components) and detected. The imbalance between the first and second components can be detected, for example, using one or more current mirrors. A difference in the first and second components can accordingly be determined.

At step 308, a biasing enhancement current can be generated. The biasing enhancement current can be generated based on the detected imbalance or difference between the first and second output components of the low bandwidth amplifier component. For example, the biasing enhancement current can be an amplified version of the difference (e.g., absolute difference or difference in magnitude) between the first and second output components of the low bandwidth amplifier component.

At step 310, the biasing enhancement current can be provided to the high bandwidth amplifier component of the amplifier. For example, the biasing enhancement current can be provided to the high bandwidth amplifier component as a biasing tail current. The tail current can be provided to the high bandwidth amplifier component by way of one or more switches (e.g., transistor switches or transmission gates). The biasing tail current provided to the high bandwidth amplifier component can improve the slew rate of the amplifier and can help reduce the imbalance between the first and second output components of the low bandwidth amplifier component. In this way, the slew rate enhancement of the amplifier provided by the high bandwidth amplifier component can improve the accuracy of the amplifier—that is, by having the amplifier settle more quickly and to reach a desired operating state more quickly.

At step 312, the imbalance between the first and second output components of the low bandwidth amplifier component can be detected. The imbalance can be detected in a manner similar to the detection of any imbalance as implemented in step 306. The detection performed at step 312 can be performed after the high bandwidth amplifier component has had an opportunity to contribute to the reduction of the imbalance at the output of the amplifier and/or the low bandwidth amplifier component.

At step 314, a determination can be made as to whether further adjustment to the operating state of the amplifier can be made. Specifically, an amount of time during which further adjustment to the operating state of the amplifier—by way of the high bandwidth amplifier component—can be referenced to determine if the amount of time has been reached or exceeded. If the maximum amount of time the high bandwidth amplifier component can be engaged has been reached or exceeded, then step 316 can be implemented. At step 316, the high bandwidth amplifier component can be disengaged. Specifically, the high bandwidth amplifier component can be de-coupled from the amplifier (e.g., by way of one or more switches). At this time, generation of the biasing enhancement current can be stopped and subsequently no longer provided to the high bandwidth amplifier component. In this way, step 314 enables the high bandwidth amplifier component to be engaged for a predetermined amount of time (e.g., a programmable and adjustable amount of time).

If the amount of time during which the high bandwidth amplifier can be engaged has not been exceeded, then step 318 can be implemented. At step 318, a determination can be made as to whether the detected imbalance exceeds a predetermined threshold. Specifically, the amount or size of the imbalance can be compared to a threshold (e.g., a programmable and adjustable threshold) to determine if the imbalance exceeds the threshold. If the threshold is not exceeded, then step 316 can be implemented. Step 316 can be implemented subsequent to step 318 if it is determined, for example, that the imbalance does not require further adjustment (e.g., the imbalance is determined to be tolerable or acceptable). If the threshold is exceeded—for example, if the imbalance is not acceptable or tolerable such that the amplifier is not yet in a desired operating state—then step 308 can be repeated. Steps subsequent to step 308 as described above can then be implemented as appropriate.

From the method 300 described above, the steps of generating a biasing enhancement current based on a newly determined imbalance (308), providing the newly generated biasing enhancement current to the high bandwidth amplifier component (310), and detecting a new imbalance (312) can be repeated as many times as necessary or as allowed by steps 314 and 318 that determine when the high bandwidth amplifier component can be disengaged.

The threshold used for comparison in step 318 can be a non-zero threshold. Further, it can be determined to proceed to step 316 when the imbalance is less than or equal to the predetermined threshold. Alternatively, it can be determined to proceed to step 316 when the imbalance is only less than the predetermined threshold (such that step 308 can be repeated if the imbalance is approximately equal to the threshold).

Further, it can be determined to proceed to step 316 from step 314 if the amount of time that has lapsed is equal to or exceeds the predetermined amount of time. Alternatively, it can be determined to proceed to step 316 from step 314 if the amount of time that has lapsed only exceeds the predetermined amount of time (such that step 308 can be repeated if the amount of time that has lapsed is approximately equal to the predetermined amount of time).

After step 316, step 320 can be implemented. At step 320, the low bandwidth amplifier component can operate on the input signal only. Step 320 can represent the amplifier reaching or converging to a desired operating state. Further, at step 320, the low bandwidth amplifier component can operate on the input signal (e.g., amplify the input signal) with low noise contribution. The output signal provided by the low bandwidth amplifier component at this time can be provided to a second stage amplifier for example.

As an alternative to the method 300, only one of steps 314 and 318 can be performed. That is, the method 300 can enable an amplifier to quickly reach a desired operating state by engaging a high bandwidth component of the amplifier for either a fixed, predetermined amount of time (e.g., a maximum amount of time) or for as long as a detected imbalance is less than (or less than and equal to) a predetermined threshold. As described above, the method 300 can also engage the high bandwidth component of the amplifier for as long as a detected imbalance is less than (or less than and equal to) a predetermined threshold and the amount of time the high bandwidth component is engaged does not exceed a fixed, predetermined amount of time (e.g., a maximum amount of time).

During steps 302-318, the high bandwidth amplifier component can be coupled to the amplifier and can provide slew rate enhancement. These steps can be considered to be an initial or transient stage of operation of the amplifier during which an imbalance in the differential outputs of the low bandwidth amplifier component is reduced. After step 316, it can be determined that a desired operating state of the amplifier has been achieved—or nearly achieved such that the low bandwidth amplifier component can operate to settle the amplifier as desired. Step 320, during which only the low bandwidth amplifier component operates on the input signal, can be considered to be the post-initial or post-transient stage of operation of the amplifier. During this time, the input signal can be operated on (e.g., amplified) by low noise components of the amplifier thereby better maintaining the integrity of the output signal of the amplifier. After step 320, the sequence of steps beginning with 302, as described above, can be repeated for a subsequent signal processing sequence by an amplifier implementing the method 300.

While various aspects of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

I claim:

1. A differential amplifier, comprising:
a first amplifier component coupled to a differential input and a differential output of the differential amplifier;
a second amplifier component coupled to the differential input;
a detector coupled to an output of the first amplifier component, the detector configured to detect an imbalance of an output signal provided by first amplifier component; and
a controller coupled to the detector and the second amplifier component, the controller configured to selectively couple the second amplifier component to the differential amplifier to reduce the detected imbalance,
wherein the first amplifier component is a low bandwidth amplifier.

2. The differential amplifier of claim 1, wherein the low bandwidth amplifier comprises one or more low noise transistors.

3. A differential amplifier, comprising:
a first amplifier component coupled to a differential input and a differential output of the differential amplifier;
a second amplifier component coupled to the differential input;
a detector coupled to an output of the first amplifier component, the detector configured to detect an imbalance of an output signal provided by first amplifier component; and
a controller coupled to the detector and the second amplifier component, the controller configured to selectively couple the second amplifier component to the differential amplifier to reduce the detected imbalance,
wherein the second amplifier component is a high bandwidth amplifier.

4. The differential amplifier of claim 3, wherein the high bandwidth amplifier comprises one or more high slew rate transistors.

5. A differential amplifier, comprising:
a first amplifier component coupled to a differential input and a differential output of the differential amplifier;
a second amplifier component coupled to the differential input;
a detector coupled to an output of the first amplifier component, the detector configured to detect an imbalance of an output signal provided by first amplifier component; and
a controller coupled to the detector and the second amplifier component, the controller configured to selectively couple the second amplifier component to the differential amplifier to reduce the detected imbalance,
wherein the controller generates a bias current based on the detected imbalance.

6. The differential amplifier of claim 5, wherein the generated bias current is an amplified version of the detected imbalance.

7. The differential amplifier of claim 5, wherein the controller selectively couples the second amplifier component to the differential amplifier by providing the generated bias current to the second amplifier component.

8. The differential amplifier of claim 7, wherein the controller provides the generated bias current to the second amplifier component when the detected imbalance exceeds a predetermined threshold.

9. The differential amplifier of claim 8, wherein the predetermined threshold is a non-zero value.

10. The differential amplifier of claim 7, wherein the controller provides the generated bias current to the second amplifier component for a period of time that is less than a predetermined maximum amount of time.

11. The differential amplifier of claim 7, wherein the controller provides the generated bias current to the second amplifier component for a period of time that is less than a predetermined maximum amount of time when the detected imbalance exceeds a predetermined threshold.

12. A method, comprising:
receiving an input signal;
detecting an imbalance of an output of a low bandwidth amplifier component of an amplifier;
generating a bias current based on the detected imbalance;
providing the generated bias current to a high bandwidth amplifier component of the amplifier; and
selectively coupling and decoupling the high bandwidth amplifier component to the amplifier to reduce the imbalance of the output of the low bandwidth amplifier.

13. The method of claim 12, wherein generating comprises amplifying the detected imbalance.

14. The method of claim 12, wherein detecting comprises generating a replica of the output of the low bandwidth amplifier component.

15. The method of claim 14, wherein generating a replica comprises generating a replica of a first output of the low bandwidth amplifier component and a second output of the low bandwidth amplifier component.

16. The method of claim 15, wherein detecting further comprises generating a difference signal based on the replica of the first output and the replica of the second output.

17. The method of claim 16, wherein detecting further comprises comparing the difference signal to a predetermined threshold.

18. The method of claim 16, wherein generating further comprises amplifying the difference signal to form the generated bias current.

19. The method of claim 17, wherein selectively coupling and decoupling the high bandwidth amplifier component further comprises coupling the high bandwidth amplifier component to the amplifier when the difference signal is above the predetermined threshold.

20. The method of claim 14, wherein selectively coupling and decoupling the high bandwidth amplifier component further comprises coupling the high bandwidth amplifier component to the amplifier for a period of time that is less than a predetermined maximum amount of time.

21. A differential amplifier, comprising:
- a first transistor coupled to a first component of a differential input of the differential amplifier and coupled to a first component of a differential output of the differential amplifier;
- a second transistor coupled to the first component of the differential input and coupled to the first component of the differential output;
- a first current sensor coupled to the first transistor and coupled to the first component of the differential input, the first current sensor configured to replicate an output current of the first transistor;
- a third transistor coupled to a second component of the differential input of the differential amplifier and coupled to a second component of the differential output of the differential amplifier;
- a fourth transistor coupled to the second component of the differential input and coupled to the second component of the differential output;
- a second current sensor coupled to the third transistor and coupled to the second component of the differential input, the second current sensor configured to replicate an output current of the third transistor;
- a detector coupled to the first and second current sensors, the detector configured to generate a current based on a difference between the replicated output current of the first transistor and the replicated output current of the third transistor;
- a comparator coupled to the detector, the comparator configured to compare the difference current generated by the detector to a predetermined threshold; and
- a controller coupled to the comparator, the controller configured to generate a bias current based on the difference current generated by the detector, wherein the controller couples the biasing current to the second and fourth transistors when the difference current is greater than the predetermined threshold.

22. The differential amplifier of claim 21, wherein the predetermined threshold is a non-zero value.

23. The differential amplifier of claim 21, wherein the biasing current is an amplified version of the difference current.

24. The differential amplifier of claim 21, wherein the controller decouples the biasing current from the second and fourth transistors when the difference current is less than the predetermined threshold.

25. An amplifier system, comprising:
- a pair of amplifiers each coupled in parallel between an input of the amplifier system and an output of the amplifier system, one of the amplifiers of the pair of amplifiers having a higher bandwidth and higher relative noise than the other amplifier; and
- a controller that activates the amplifiers in response to receiving an input signal and deactivates the high bandwidth amplifier at a time earlier than the other amplifier, wherein the controller deactivates the high bandwidth amplifier when the other amplifier settles to within a predetermined accuracy.

26. An amplifier system, comprising:
- a pair of amplifiers each coupled in parallel between an input of the amplifier system and an output of the amplifier system, one of the amplifiers of the pair of amplifiers having a higher bandwidth and higher relative noise than the other amplifier;
- a controller that activates the amplifiers in response to receiving an input signal and deactivates the high bandwidth amplifier at a time earlier than the other amplifier; and
- a sensor coupled to the lower bandwidth amplifier to measure an operating point of the lower bandwidth amplifier, wherein the controller deactivates the high bandwidth amplifier in response to an output of the sensor.

* * * * *